United States Patent [19]

Sauer

[11] 4,342,001
[45] Jul. 27, 1982

[54] DIFFERENTIAL AMPLIFIER HAVING A LOW-PASS CHARACTERISTIC

[75] Inventor: Donald J. Sauer, Plainsboro, N.J.
[73] Assignee: RCA Corporation, New York, N.Y.
[21] Appl. No.: 131,045
[22] Filed: Mar. 17, 1980
[51] Int. Cl.$^3$ .............................................. H03F 1/02
[52] U.S. Cl. ......................................... 330/9; 330/252
[58] Field of Search ................................... 330/9, 252

[56] References Cited

U.S. PATENT DOCUMENTS 3,153,202  10/1964  Woolam .................................. 330/9
4,086,541   4/1978  Katou .................................... 330/9
4,109,308   8/1978  Rodel .................................... 330/9

FOREIGN PATENT DOCUMENTS 576611  10/1977  U.S.S.R. ................................. 330/9

*Primary Examiner*—Michael J. Tokar
*Attorney, Agent, or Firm*—E. M. Whitacre; J. S. Tripoli; R. G. Coalter

[57] ABSTRACT

The input terminal of a voltage follower is coupled to a point of reference potential via a first capacitor. A second capacitor is alternately connected across a source of input signals and connected in parallel with the voltage follower during mutually exclusive time intervals whereby an output voltage is produced across the first capacitor proportional to a differential mode component of the input signal. The arrangement is such that internally generated noise is suppressed, very low frequency breakpoints (lag) may be realized with practical element values and there is substantially no tendency toward saturation in the presence of high frequency input noise components.

9 Claims, 4 Drawing Figures

DIFFERENTIAL AMPLIFIER HAVING A LOW-PASS CHARACTERISTIC

Differential amplifiers having a low-pass characteristic are well known in the art and are frequently used in feedback control systems for regulating parameters such as frequency, phase, amplitude, d.c. level, etc. of a signal being processed.

A significant problem exists when a conventional differential amplifier is used for amplifying low frequency signals which may be accompanied by significant amounts of high frequency noise. For example, in amplifiers of the type which utilize the Miller effect to obtain a low-pass characteristic, one or more stages may be saturated if the input signal includes a high amplitude impulse noise component having a pulse width or duration which is less than the amplifier response time. Pre-filtering of the signal to obtain a low-pass characteristic can lead to impractical element values where a very low frequency break point is desired and provides no suppression of noise generated within the amplifier. Post filtering does suppress noise generated in the amplifier but cannot generally prevent amplifier saturation upon the occurrence of noise components in the input signal.

The present invention is directed to meeting the need for a differential amplifier having a low-pass characteristic and in which: (1) internally generated noise is suppressed; (2) very low frequency breakpoints may be realized with practical element values and (3) there is substantially no tendency for the amplifier to saturate in the presence of high frequency input noise components.

In accordance with the present invention means are provided for coupling the input of a voltage follower to a point of reference potential via a capacitor and alternately connecting a further capacitor across two input terminals and connecting the further capacitor in parallel with the voltage follower during mutually exclusive time intervals.

In accordance with another aspect of the invention, the voltage follower is of a type exhibiting an offset voltage and means are provided for adding a differential mode voltage component to the amplifier input signal for counteracting the offset.

The invention is illustrated in the accompanying drawings wherein like reference numbers designate like elements and in which.

Figure 1:
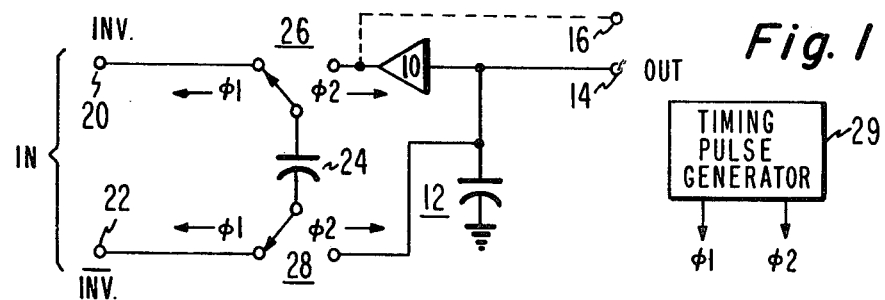
FIG. 1 is a block diagram, partially in schematic form, of a differential amplifier embodying the invention.

In FIG. 1, amplifier 10 is a voltage follower having a voltage gain not greater than unity. It may be, for example, a unity gain non-inverting operational amplifier, an emitter follower, a cathode follower or a source follower. Preferably, in this embodiment, it may be an offset cancelling complementary cascade source follower or emitter follower. In such voltage followers, which are well known, a substantially zero offset is realized by applying the output of a voltage follower transistor of one conductivity type to the input of a voltage follower transistor of opposite conductivity type (e.g., a cascade connection of an NPN common collector stage followed or preceeded by a PNP common collector stage).

The input of voltage follower 10 is coupled to a point of reference potential (ground) via a capacitor 12 and to an output terminal 14. The purpose of connecting output terminal 14 to the input terminal of follower 10 is to provide an output signal proportional to the state of charge of capacitor 12 which is free of any offset voltage component which may be exhibited by follower 10. Alternatively, as indicated by dashed lines, an output signal proportional to the state of charge of capacitor 12 may be derived from the differential amplifier by coupling an alternative output terminal 16 to the output of follower 10. Deriving an output signal in this manner has the advantage of providing a low source impedance for driving subsequent loads.

Capacitor 12 receives charge in proportion to the differential mode component of an input signal applied across inverting (20) and noninverting (22) input terminals by means of a further capacitor 24 and a switching arrangement comprising two single pole double throw switches 26 and 28 controlled by a two phase timing pulse generator 29. Switch 26 is arranged to connect the upper plate of capacitor 24 to the inverting input terminal 20 in response to a phase one ($\phi 1$) signal produced by the generator 29 and to connect the upper plate of capacitor 24 to the output of amplifier 10 in response to a phase two ($\phi 2$) signal of generator 29. Switch 28 is arranged to connect the lower plate of capacitor 24 to the amplifier noninverting input terminal 22 in response to $\phi 1$ and to connect the lower plate to capacitor 24 to the input of voltage follower 10 in response to $\phi 2$. The generator phases $\phi 1$ and $\phi 2$ are nonoverlapping, that is, they are present only during mutually exclusive time periods.

In operation switches 26 and 28 alternately connect capacitor 24 across the inverting (20) and non-inverting (22) input terminals of the differential amplifier and connect capacitor 24 in parallel with the voltage follower during mutually exclusive time periods. During the period when $\phi 1$ is present capacitor 24 receives a charge in proportion to the differential mode component of the input signal applied across terminals 20 and 22. During the period when $\phi 2$ is present the connection of capacitor 24 in parallel with voltage follower 10 results in a positive feedback effect which causes charge of capacitor 24 to be transferred to capacitor 12 and so produces an incremental change in output voltage at terminal 14 (or 16) proportional to the differential mode voltage and the ratio of the values of capacitors 24 and 12. Where the differential mode component of the input signal is zero and only a common mode component is present capacitor 24 receives no charge during the $\phi 1$ period. Accordingly, no charge is transferred to capacitor 12 during the $\phi 2$ period and the common mode component is therefore rejected.

The frequency response of the differential amplifier of FIG. 1 is characterized by a dominant low frequency breakpoint (lag) which, to a good approximation, depends upon a capacitance ratio and a switching frequency. This is an advantage in that very low frequency breakpoints (a few Hertz or less) may be realized without need for high valued resistors or capacitors. Capacitor 24 exhibits an equivalent resistance, $R_e$, (in Ohms) which may be approximated by the reciprocal of the product of its value (in Farads) multiplied by the switching frequency, $f_s$ (in Hertz).

From the foregoing and with the simplifying assumption that $R_e \simeq R_t$ where $R_t$ is the total resistance in the capacitor 24 charge-discharge path and that the offset voltage of follower 10 is negligible one may approximate the dominant breakpoint (lag) for the differential amplifier of FIG. 1 as:

$$f_c = (f_s C_{24}/2\pi C_{12}) \qquad (1)$$

wherein:
$f_c$ is the corner frequency in Hertz,
$f_s$ is the switching frequency in Hertz,
$C_{12}$ is the value of capacitor 12 in Farads, and
$C_{24}$ is the value of capacitor 24 in Farads.

The open loop d.c. voltage gain of the differential amplifier of FIG. 1 is a function of the voltage gain of follower 10. Specifically:

$$A_v = f(1/1-A) \qquad (2)$$

wherein:
$A_v$ is the differential mode voltage gain, and
A is the voltage follower voltage gain.

It is instructive to note from equation 2 that the amplifier voltage gain increases as the voltage gain of voltage follower 10 approaches unity. Equation 2 does not apply for a voltage follower gain greater than unity. In that case a regenerative condition would occur which would render the amplifier inoperable. Accordingly, it is an aspect of the invention that amplifier 10 exhibit a voltage gain not greater than unity.

Summarizing the features of the example of FIG. 1, very low frequency breakpoints may be realized without resort to relatively high valued components. This follows from equation 1 and the discussion thereof. A further feature is that all noise components present in the input signal are integrated by capacitor 12 as well as noise components generated within voltage follower 10. Since the input signal to voltage follower 10 is coupled to capacitor 12, which smooths input noise components, there is little likelihood of saturation of amplifier 10 regardless of the pulse width or amplitude of the input noise components.

Figure 2:
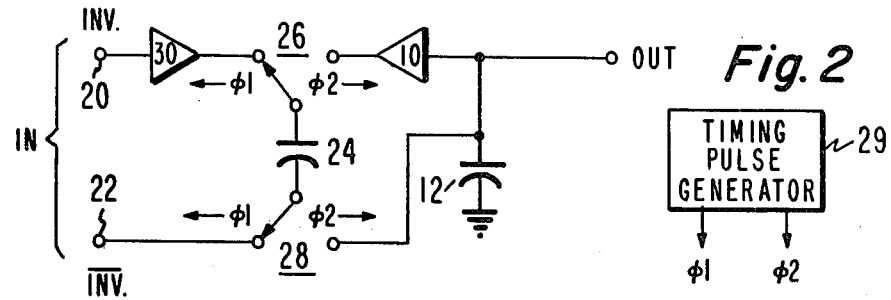
FIG. 2 is a block diagram, partially in schematic form, illustrating a modification of the differential amplifier of FIG. 1.

In the discussion of FIG. 1 it was assumed that voltage follower 10 exhibited a relatively small or negligible offset voltage. Such a characteristic is desirable but is not essential to achieving the benefits of the invention. The effect of offset voltage in voltage follower 10 would be to introduce a d.c. offset in the output voltage. In cases where the offset of follower 10 is objectionable, one may nullify its effect in accordance with a further aspect of the invention by adding an equal offset to the input signal in the form of a differential mode component as shown in FIG. 2. The cancelling offset is introduced by connecting a second voltage follower 30 in the circuit path between inverting input terminal 20 and switch 26 with the amplifier 30 input connected to terminal 20 and its output connected to switch 26.

Operation of the embodiment of FIG. 2 is substantially the same as that of FIG. 1 with the exception that capacitor 24 charges to a voltage level equal to the differential mode component of the input signal across terminals 20 and 22 minus the offset voltage of voltage follower 30. Accordingly, when the differential mode component is zero, capacitor 24 is charged to the offset voltage of follower 30 during the $\phi 1$ period but since this voltage equals the offset voltage of follower 10, no charge is transferred to capacitor 12 during the $\phi 2$ period, and thus the output voltage is rendered independent of the offset voltage of follower 10. Maximum offset compensation is achieved when the offset of follower 30 is selected to be substantially equal to that of follower 10. Preferably followers 10 and 30 are constructed with substantially identical devices supplied with substantially identical quiescent bias currents.

Figure 3:
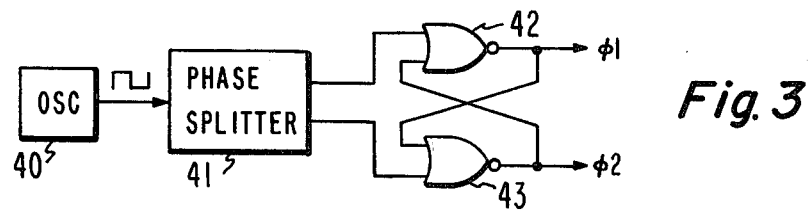
FIG. 3 is a block diagram of a timing pulse generator suitable for use with the differential amplifier of the invention.

FIG. 3 illustrates a preferred method of generating nonoverlapping timing pulses for control of switches 26 and 28. In FIG. 3 an oscillator 40 is connected to supply a square wave switching signal to a phase splitter 41 which supplies true and complemented square wave output signals to respective input terminals of NOR gates 42 and 43. The output terminal of each NOR gate is cross coupled to an input terminal of the other thereby providing feedback which prevents simultaneous enablement of the gates. Accordingly the $\phi 1$ and $\phi 2$ signals produced at the output terminals of gates 42 and 43, respectively, occur during mutually exclusive time periods. Referring again to equation 1, the frequency of oscillator 40 may be varied for controlling the corner frequency, $f_c$, of the differential amplifier.

Figure 4:
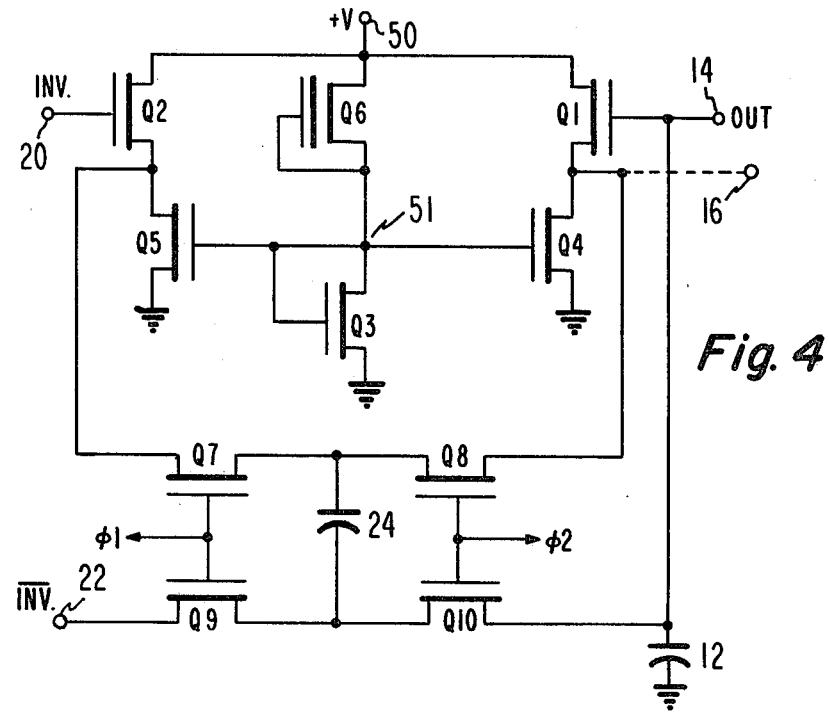
FIG. 4 is a schematic diagram of a differential amplifier embodying the invention.

FIG. 4 illustrates a preferred implementation of the differential amplifier of FIG. 2 with N-channel field effect transistors. With the exception of self biased depletion mode transistor Q6, all other transistors are enhancement mode devices. Amplifiers 10 and 30 are implemented by common drain connected transistors Q1 and Q2 which function as source (voltage) followers. Transistor Q1 is connected at the gate electrode thereof to output terminal 14 and via capacitor 12 to ground. The drain electrodes of Q1 and Q2 are connected to a supply voltage terminal 50 for receiving a source of positive operating potential +V. The gate electrode of transistor Q2 is connected to inverting input terminal 20. Preferably transistors Q1 and Q2 are matched so as to exhibit equal values of gate-to-source voltage, $V_{gs}$, for equal values of source current. In this way, one may balance the offset voltages of Q1 and Q2 by regulating the quiescent source currents at constant equal values. This function is provided by a dual output current mirror amplifier formed by transistors Q3–Q5 which is supplied with output current regulated by self biased depletion mode transistor Q6.

More specifically the source electrodes of transistors Q1 and Q2 are connected, respectively, to the drain electrodes of common source connected transistors Q4 and Q5. Transistors Q4 and Q5 are selected to have matched transconductances and are connected at the gate electrodes thereof to node 51. The voltage at node 51 is regulated by means of self biased common source connected transistor Q3 coupled between node 51 and ground. A constant current is supplied to node 51 via self biased depletion mode transistor Q6 coupled between supply terminal 50 and node 51. Since transistors Q4 and Q5 have matched transconductances and have equal gate to source voltage regulated by a common element (Q3) the quiescent source currents of source follower transistors Q1 and Q2 will be matched and so Q1 and Q2 will exhibit substantially equal values of offset voltage.

Switch 26 of FIG. 2 is implemented in FIG. 4 by means of transistors Q7 and Q8 the conduction paths of which are connected in series in that order between the source electrodes of transistors Q2 and Q1. Switch 28 is implemented by means of transistors Q9 and Q10 the conduction paths of which are connected in series in that order between noninverting input terminal 22 and the gate electrode of source follower transistor Q1. As in FIG. 2, the follower input (Q1 gate) is connected to the amplifier output terminal 14 and to ground via capacitor 12. Capacitor 24 is connected between the common connection of the conduction paths of transistors Q7 and Q8 and the common connection of the conduction paths of transistors Q9 and Q10. Control of transistors Q7–Q10 is provided by applying the $\phi 1$ output of timing pulse generator 29 to the gate electrodes of transistors Q7 and Q9 and applying the $\phi 2$ output to the gate electrodes of transistors Q8 and Q10. As in the example of FIG. 1 an output signal free of offset may be taken from terminal 14 or alternatively (as indicated by dashed lines) an output signal may be taken from terminal 16 which is connected to the source electrode of transistor Q1 where a low output impedance is desired.

The general operation of the circuit of FIG. 4 corresponds to that previously described for FIG. 2. Transistors Q7 and Q9 turn on when the $\phi 1$ voltage is high whereby capacitor 24 charges to a voltage level equal to the differential mode signal component of the input signal applied across terminals 22 and 20 less the gate to source voltage of source follower transistor Q2. When the $\phi 2$ voltage is high transistors Q8 and Q10 turn on and the charge in capacitor 24 due solely to the differential mode component of the input signal is transferred to capacitor 12 and results in a change in output voltage proportional to the differential mode component and substantially independent of the offset voltages ($V_{gs}$) of transistors Q1 and Q2. When neither $\phi 1$ nor $\phi 2$ is high, transistors Q7–Q10 are all off whereby capacitor 24 is effectively isolated from the input terminals and from the source follower transistor Q1.

It will be appreciated that bipolar transistors rather than field effect transistors may be used in practicing the invention and that the conductivity types may be reversed with appropriate change in relative operating potentials. Although a commonly regulated current source has been shown for transistors Q1 and Q2 one may instead utilize separate regulated or unregulated sources in a particular application. It will also be appreciated that the differential amplifiers of the invention may be used in inverting and noninverting circuit applications by appropriate application of feedback which may be negative for linear response or positive where a non-linear characteristic is desired.

What is claimed is:

1. A differential amplifier having a low-pass characteristic comprising, in combination:
   first and second amplifier input terminals for receiving an input signal thereacross;
   first and second capacitors;
   a voltage follower having an input terminal connected via said second capacitor to a point of reference potential;
   means for alternately connecting said first capacitor across said amplifier input terminals and connecting said first capacitor in parallel with said voltage follower during mutually exclusive time periods, and
   output means coupled to a point in said amplifier for providing an output voltage proportional to the state of charge of said second capacitor.

2. A differential amplifier having a low-pass characteristic comprising, in combination:
   first and second amplifier input terminals for receiving an input signal thereacross;
   first and second capacitors;
   a voltage follower having an input terminal connected via said second capacitor to a point of reference potential and being of a type exhibiting an offset voltage tending to cause said amplifier to exhibit an input offset voltage;
   means for alternately connecting said first capacitor across said amplifier input terminals and connecting said first capacitor in parallel with said voltage follower during mutually exclusive time periods;
   output means coupled to a point in said amplifier for providing an output voltage proportional to the state of charge of said second capacitor;
   a second voltage follower having an offset voltage substantially the same as that of the first mentioned voltage follower; and
   means for adding the offset voltage of said second voltage follower to said input signal in a sense to minimize said input offset voltage of said amplifier.

3. A differential amplifier having a low-pass characteristic comprising, in combination:
   first and second amplifier input terminals for receiving an input signal thereacross;
   first and second capacitors;
   a voltage follower having an input terminal connected via said second capacitor to a point of reference potential;
   electronic switch means responsive to a first control signal manifestation for coupling said first capacitor across said amplifier input terminals, responsive to a second control signal manifestation for isolating said first capacitor from said input terminals and from said voltage follower and responsive to a third control signal manifestation for connecting said first capacitor in parallel with said voltage follower; and
   output means coupled to a point in said amplifer for providing an output voltage proportional to the state of charge of said second capacitor.

4. A differential amplifier as recited in claim 3 wherein said electronic switch means includes four transmission gates and further comprises timing pulse generator means for supplying a first control signal to one pair of the gates during a first time interval and a second control signal to another pair of the gates during a second nonoverlaping time interval, said generator comprising:
   an oscillator for producing an output signal;
   a phase splitter responsive to the oscillator output signal for producing two complementary output signals;
   a pair of gates for deriving said control signals from said complementary output signals; and
   a separate feedback path from the output of each gate to the input of the other for preventing said gates from being simultaneously enabled.

5. A differential amplifier as recited in claim 2 wherein said output means comprises:
   an output terminal; and
   means coupling said output terminal to said input terminal of said voltage follower.

6. A differential amplifier as recited in claim 2 wherein said output means comprises:
   an output terminal; and
   means coupling said output terminal to an output terminal of said voltage follower.

7. A differential amplifier having a low-pass characteristic comprising:
- an inverting amplifier input terminal and a noninverting amplifier input terminal for receiving a differential input voltage thereacross;
- an input capacitor and an output capacitor;
- a first voltage follower having an input terminal connected via said output capacitor to a point of reference potential;
- a second voltage follower having an input terminal connected to one of said amplifier input terminals;
- switch means for alternately connecting said input capacitor across an output terminal of said second voltage follower and the other of said amplifier input terminals and for connecting said input capacitor in parallel with said first voltage follower during mutually exclusive time intervals; and
- an output terminal coupled to a point in said amplifier for providing an output voltage proportional to the state of charge of said output capacitor.

8. A differential amplifier as recited in claim 7 wherein said input terminal of said second voltage follower is coupled to said inverting amplifier input terminal and wherein said switch means comprises:
- a first transmission gate having a conduction path connected between a first plate of said input capacitor and said noninverting amplifier input terminal;
- a second transmission gate having a conduction path connected between a second plate of said input capacitor and said output terminal of said second voltage follower;
- a third transmission gate having a conduction path connected between an output terminal of said first voltage follower and said second plate of said input capacitor;
- a fourth transmission gate having a conduction path connected between said input terminal of said first voltage follower and said first plate of said input capacitor; and
- timing pulse generator means coupled to said transmission gates for periodically closing said first and second transmission gates during a first time interval and for closing said third and fourth transmission gates during a second nonoverlapping time interval.

9. An amplifier comprising, in combination:
- two input terminals;
- first and second capacitors;
- a voltage follower having an input terminal coupled to a point of reference potential via said second capacitor; and
- switch means for alternately connecting said first capacitor to said two input terminals and connecting said first capacitor in parallel with said voltage follower during mutually exclusive time intervals.

* * * * *